(12) United States Patent
Itoh

(10) Patent No.: US 6,292,037 B1
(45) Date of Patent: Sep. 18, 2001

(54) OUTPUT CIRCUIT OF SEMICONDUCTOR INTEGRATED CIRCUIT

(75) Inventor: Naoki Itoh, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/665,964

(22) Filed: Sep. 21, 2000

(30) Foreign Application Priority Data

Sep. 24, 1999 (JP) ................................................ 11-270538

(51) Int. Cl.[7] ........................................................ H03K 3/00
(52) U.S. Cl. .......................................... 327/112; 327/111
(58) Field of Search ..................................... 327/111, 112, 327/109, 108, 129, 130, 131, 170, 171, 437, 434, 333

(56) References Cited

U.S. PATENT DOCUMENTS 6,130,563 * 10/2000 Pilling et al. .......................... 327/111
6,211,707 * 4/2001 Choi ...................................... 327/112

FOREIGN PATENT DOCUMENTS 2000-49585   2/2000   (JP) .

* cited by examiner

Primary Examiner—Timothy P. Callahan
Assistant Examiner—Linh Nguyen
(74) Attorney, Agent, or Firm—Finnegan, Henderson, Farabow, Garrett & Dunner, L.L.P.

(57) ABSTRACT

An output circuit includes a drive signal output circuit for outputting a drive signal, an output stage circuit including a PMOS transistor of pull-up side connected between a power supply potential and an output terminal, and an NMOS transistor of pull-down side connected between the output terminal and a ground potential, gate of the NMOS transistor being connected to an output node of the drive signal output circuit, an output drive control circuit for outputting a signal to be supplied to the gate of the PMOS transistor of pull-up side, a feedback capacitor connected between the output terminal and the output node of the drive signal output circuit, and a potential limiter circuit for limiting an amplitude of the signal of the output node of the drive signal output circuit on the basis of the output voltage of the output terminal.

16 Claims, 5 Drawing Sheets

US 6,292,037 B1

OUTPUT CIRCUIT OF SEMICONDUCTOR INTEGRATED CIRCUIT

CROSS-REFERENCE TO RELATED APPLICATIONS

This application is based upon and claims the benefit of priority from the prior Japanese Patent Application No. 11-270538, filed Sep. 24, 1999, the entire contents of which are incorporated herein by reference.

BACKGROUND OF THE INVENTION

The present invention relates to an output circuit of a semiconductor integrated circuit. In particular, the present invention relates to a circuit for controlling the rise time/fall time of an output signal in an output circuit having a CMOS configuration. The present invention is used in USB (Universal Serial Bus) ports of personal computers and peripheral devices having a relatively medium or low speed.

It is important as a technique for preventing occurrence of switching noise to control the inclination of a signal waveform at the time of fall and rise of an output signal of an output circuit of a large scale integrated circuit (LSI), i.e., control the fall time and rise time of the output signal.

FIG. 1 shows the configuration of a typical output circuit section of an LSI used in USB ports of personal computers.

This output circuit section uses two power supplies. This output circuit section includes two-stage inverting amplifier circuits 11 and 12 operating with a first power supply potential VDD, and two CMOS output circuits 13 and 14 operating with the first power supply potential VDD and a second power supply potential VCC.

An input signal IN is supplied to the inverting amplifier circuit 11. An output signal IN1 is outputted from the inverting amplifier circuit 11. The output signal IN1 from the inverting amplifier circuit 11 is supplied to the other inverting amplifier circuit 12. An output signal IN2 is outputted from the inverting amplifier circuit 12.

The output signal IN2 of the inverting amplifier circuit 12 is inputted to a first input terminal INA of a first output circuit 13 and a second input terminal INB of a second output circuit 14. The output signal IN1 of the inverting amplifier circuit 11 is inputted to a second input terminal INB of the first output circuit 13 and a first input terminal INA of the second output circuit 14.

On the basis of two inputted signals IN1 and IN2, the two output circuits 13 and 14 output signals OUT-PLUS and OUT-MNUS having levels which are complementary to each other to an external bus which is not illustrated.

FIG. 2 shows a conventional concrete circuit configuration of the first output circuit 13 among two output circuits 13 and 14 shown in FIG. 1.

This output circuit includes a voltage comparator circuit 21 of CMOS type operating with a first power supply potential VDD (for example, 5 V), an output stage circuit 22 and an output drive control circuit 23 operating with a second power supply potential VCC (for example, 3.3 V), and a feedback capacitor C1 connected between an output terminal BOUTP of the output stage circuit 22 and an output node n1 of the voltage comparator circuit 21 to control the rise time/fall time of an output signal.

The voltage comparator circuit 21 includes a current source I1, P-channel MOS transistors (hereafter referred to as PMOS transistors) MP1 and MP2, and N-channel MOS transistors (hereafter referred to as NMOS transistors) MN1 and MN2. The output stage circuit 22 includes a PMOS transistor MP4 and an NMOS transistor MN5. The output drive control circuit 23 includes a PMOS transistor MP3 and NMOS transistors MN3 and MN4.

The voltage comparator circuit 21 is a circuit of differential input type supplied with the output signals IN1 and IN2 fed from the two-stage inverting amplifier circuits 11 and 12 shown FIG. 1. An output signal fed from an output node n1 of the voltage comparator circuit 21 is inputted to gate of an NMOS transistor MN5 of pull-down side in the output stage circuit 22. The output drive control circuit 23 receives the output signal of the node n1 of the voltage comparator circuit 21, and outputs a signal to be inputted to gate of a PMOS transistor MP4 of pull-up side in the output stage circuit 22.

It should be noted that in the second output circuit 14 of FIG. 1 the connection relations of the complementary input signals IN1 and IN2 inputted to the voltage comparator circuit 21 are opposite to those described above.

Source of the PMOS transistor MP4 of pull-up side is connected to a node of the second power supply voltage VCC, and drain of the PMOS transistor MP4 is connected to the output terminal BOUTP. Furthermore, drain of the NMOS transistor MN5 of pull-down side is connected to the output terminal BOUTP, and drain of the NMOS transistor MN5 is connected to a node of a ground potential DGND.

FIG. 3 shows an example of a simulation result of input-output characteristics of the output circuit section of FIG. 1 using the conventional output circuit shown in FIG. 2.

When the input signal IN is 5 V, the signal IN1 is 0 V and the signal IN2 is 5V.

At this time, in the first output circuit 13, the output signal of the voltage comparator circuit 21 becomes 0 V, the output signal of the output drive control circuit 23 becomes a voltage close to 0 V. The PMOS transistor MP4 of pull-up side turns on, and the NMOS transistor MN5 of pull-down side turns off. Therefore, a signal OUT-PLUS outputted from the output terminal BOUTP becomes "H" (3.3 V).

On the other hand, when the input signal IN is 5 V, the output signal of the voltage comparator circuit 21 becomes 5 V in the second output circuit 14 as described above. The PMOS transistor MP4 of pull-up side turns off, and the NMOS transistor MN5 of pull-down side turns on. An output signal OUT-MNUS outputted from the output circuit becomes "L" (close to 0 V).

When the input signal IN has changed from 5V to 0 V, the signal IN1 changes from 0 V to 5 V and the signal IN2 changes from 5 V to 0 V. In the first output circuit 13, therefore, the signal potential of the output node n1 of the voltage comparator circuit 21 rises from 0 V toward 5 V. At this time, the capacitor element C1 is charged, and consequently the rise rate of the potential of the node n1 becomes slow. As a result of the potential rise of the node n1, the NMOS transistor MN5 of pull-down side turns on and the PMOS transistor MP4 of pull-up side turns off. As a result, the potential of the output terminal BOUTP (the output signal OUT-PLUS) falls from "H" (VCC=3.3 V) toward "L" (close to 0 V).

At this time, as the potential of the output terminal BOUTP falls, the capacitor element C1 is charged. As a result, the node n1 is pulled toward the ground potential GND, and the rise rate of the potential of the node n1 becomes slower. Therefore, the fall rate at the time when the on-resistance of the NMOS transistor MN5 of pull-down side is lowered by the potential rise of the node n1 is further made slow. The fall rate of the potential of the output terminal BOUTP is also lowered.

At this time, the NMOS transistor MN5 of pull-down side has a threshold voltage of approximately 0.7 V. In such a process that the gate input voltage changes from 0 V to 5 V, the NMOS transistor MN5 of pull-down side remains off until the gate input voltage reaches 0.7 V. If the gate input voltage exceeds 0.7 V, the on-current gradually flows and the on-resistance gradually decreases. Therefore, the fall timing of the output signal OUT-PLUS becomes later than the timing of the change of the input signal IN from 5 V to 0 V. In FIG. 3, this delay time is denoted by t1.

On the other hand, when the input signal IN has changed from 5 V to 0 V, the potential of the node n1 of the voltage comparator circuit 21 falls from 5 V toward 0 V as described earlier. As a result, the PMOS transistor MP4 of pull-up side turns on and the NMOS transistor MN5 of pull-down side turns off. The potential of the output terminal BOUTP, i.e., the output signal OUT-MINUS attempts to rise from "L" (close to 0 V) toward "H" (VCC=3.3 V). At this time, the potential of the output terminal BOUTP rises, the capacitor element C1 is discharged. As a result, the fall rate of the potential of the node n1 becomes slower. Therefore, the fall rate at the time when the on-resistance of the NMOS transistor MN5 of pull-down side is increased by the potential fall of the node n1 is further made slow. Therefore, the rise rate of the potential of the output terminal BOUTP is also lowered. Therefore, the rise timing of the output signal OUT-PLUS becomes later than the timing of the change of the input signal IN from 5 V to 0 V. In FIG. 3, this delay time is denoted by t2.

In other words, when the potential (logic level) of the output node (drive signal source node) n1 of the voltage comparator circuit 21 changes with an amplitude between VDD and DGND, the rise rate and the fall rate of the potential of the node n1 is made slower by the function of the capacitor element C1, in the conventional output circuit shown in FIG. 2. And the time t1 elapsing until the NMOS transistor MN5 of pull-down side begins to turn on in the first output circuit differs from the time t2 elapsing until the NMOS transistor MN5 of pull-down side begins to turn off in the second output circuit (t1>t2).

In specifications of USB, the rise time and the fall time of the output signals OUT-PLUS and OUT-MNUS and crosspoints where potentials of both signals cross each other are stipulated. In order to satisfy the specifications, there has been desired emergence of such an output circuit that the output signals OUT-PLUS and OUT-MNUS change nearly simultaneously in response to a change of the input signal IN.

In the convention output circuit, the PMOS transistor of pull-up side and the NMOS transistor of pull-down side are connected to the output terminal, and the feedback capacitor is connected to the output stage, as described above. When the potential of the drive signal source node connected to a first end side of the feedback capacitor changes, the rise rate and the fall rate of the potential of the node are made slower by the function of the capacitor element. In addition, since the time taken until the NMOS transistor of pull-down side begins to turn on differs from the time taken until the NMOS transistor of pull-down side begins to turn off, favorable input-output characteristics are not obtained. The convention output circuit has such problems.

BRIEF SUMMARY OF THE INVENTION

Therefore, an object of the present invention is to provide a semiconductor integrated circuit having an output circuit capable of activating the output stage transistor in response to the potential change of the output node of the drive signal output circuit, making the time taken until the NMOS transistor of pull-down side begins to turn on substantially equal to the time taken until the NMOS transistor of pull-down side begins to turn off, and consequently providing favorable input-output characteristics.

In accordance with a first aspect of the present invention, an output circuit of semiconductor circuit includes: a drive signal output circuit having a first output node, the drive signal output circuit outputting a drive signal from the first output node; an output stage circuit including a first transistor for pull-up and a second transistor for pull-down, the first transistor having a gate, the first transistor being connected between a power supply potential node and an output terminal, the second transistor having a gate connected to the first output node of the drive signal output circuit, the second transistor being connected between the output terminal and a ground potential node; an output drive control circuit having a second output node, the output drive control circuit being connected to the first output node of the drive signal output circuit, the output drive control circuit outputting a signal to be supplied to the gate of the first transistor, based on the signal of the first output node of the drive signal output circuit; a feedback capacitor connected between the output terminal and the first output node of the drive signal output circuit; and a potential limiter circuit connected to the output terminal and the first output node of the drive signal output circuit, the potential limiter circuit limiting an amplitude of the signal of the first output node of the drive signal output circuit so as to confine the amplitude with a predetermined range.

In accordance with a second aspect of the present invention, an output circuit of semiconductor circuit includes: a drive signal output circuit connected between a first power supply potential node and a ground potential node, the drive signal output circuit having a first output node, the drive signal output circuit outputting a drive signal having an amplitude between the first power supply potential and the ground potential, from the first output node; an output stage circuit including a first transistor for pull-up and a second transistor for pull-down, the first transistor being connected between a second power supply potential node and an output terminal, the first transistor having a gate, the second transistor having a gate connected to the first output node of the drive signal output circuit, the second transistor being connected between the output terminal and the ground potential node; an output drive control circuit having a second output node, the output drive control circuit being connected to the first output node of the drive signal output circuit, the output drive control circuit outputting a signal to be supplied to the gate of the first transistor, based on the signal of the first output node of the drive signal output circuit; a feedback capacitor connected between the output terminal and the first output node of the drive signal output circuit; and a potential limiter circuit connected to the output terminal and the first output node of the drive signal output circuit, the potential limiter circuit limiting an amplitude of the signal of the first output node of the drive signal output circuit so as to confine the amplitude with a predetermined range.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
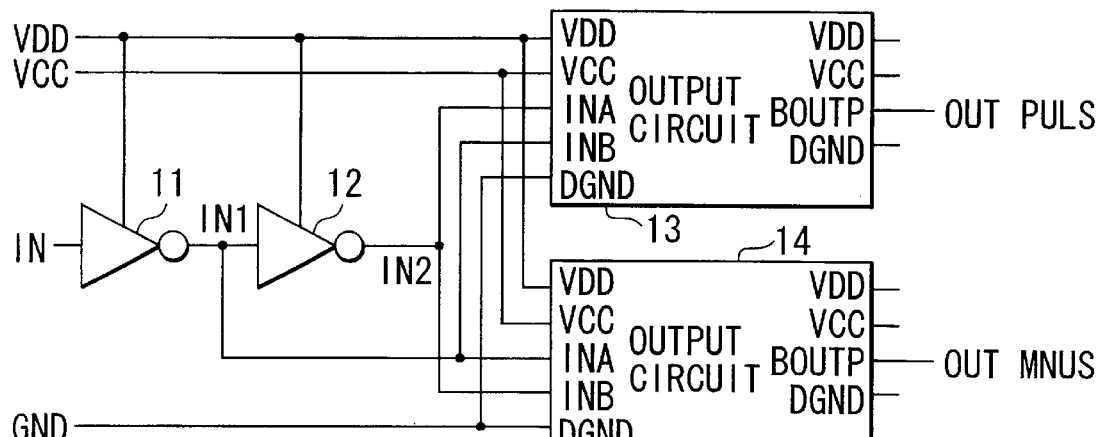
FIG. 1 is a block diagram showing the configuration of a typical output circuit section of an LSI used in USB ports of personal computers.

Hereafter, embodiments of the present invention will be described by referring to the drawing.

Figure 4:
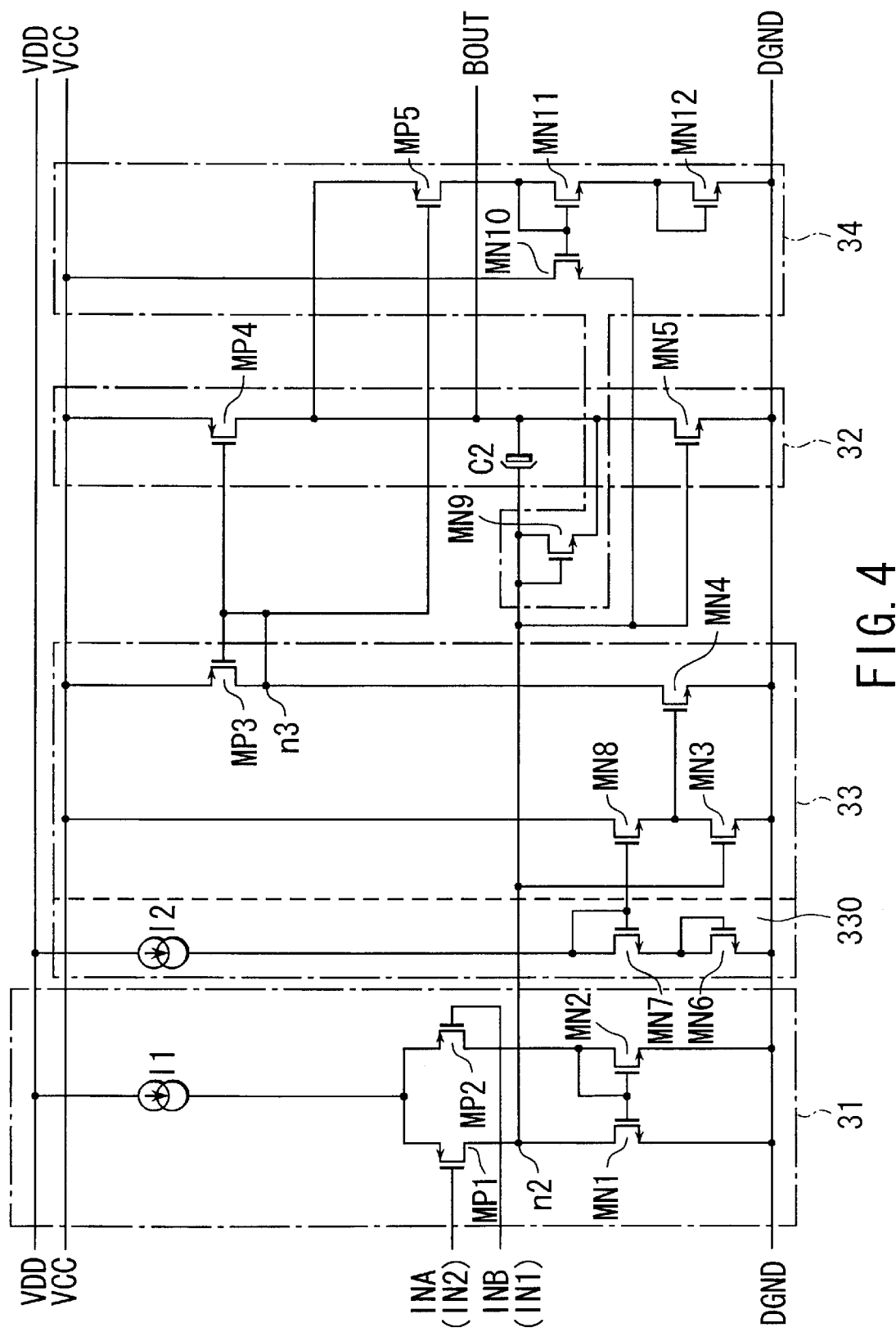
FIG. 4 is a circuit diagram showing an output circuit according to a first embodiment of the present invention.

FIG. 4 shows an output circuit of CMOS type according to a first embodiment of the present invention.

This output circuit is provided in an LSI used in USB ports of personal computers as described earlier by referring to FIG. 1. Detailed configuration of one of two output circuits 13 and 14 of CMOS type which output complementary output signals.

This output circuit includes a voltage comparator circuit 31 of CMOS type operating with a first power supply potential VDD (for example, 5 V), an output stage circuit 32 operating with a second power supply potential VCC (for example, 3.3 V), and an output drive control circuit 33 operating with the second power supply potential VCC, a potential limiter circuit 34 operating with the second power supply potential VCC, and a feedback capacitor C2 connected between an output terminal BOUT of the output stage circuit 32 and an output node n2 of the voltage comparator circuit 31 to control the rise time/fall time of an output signal.

Figure 2:
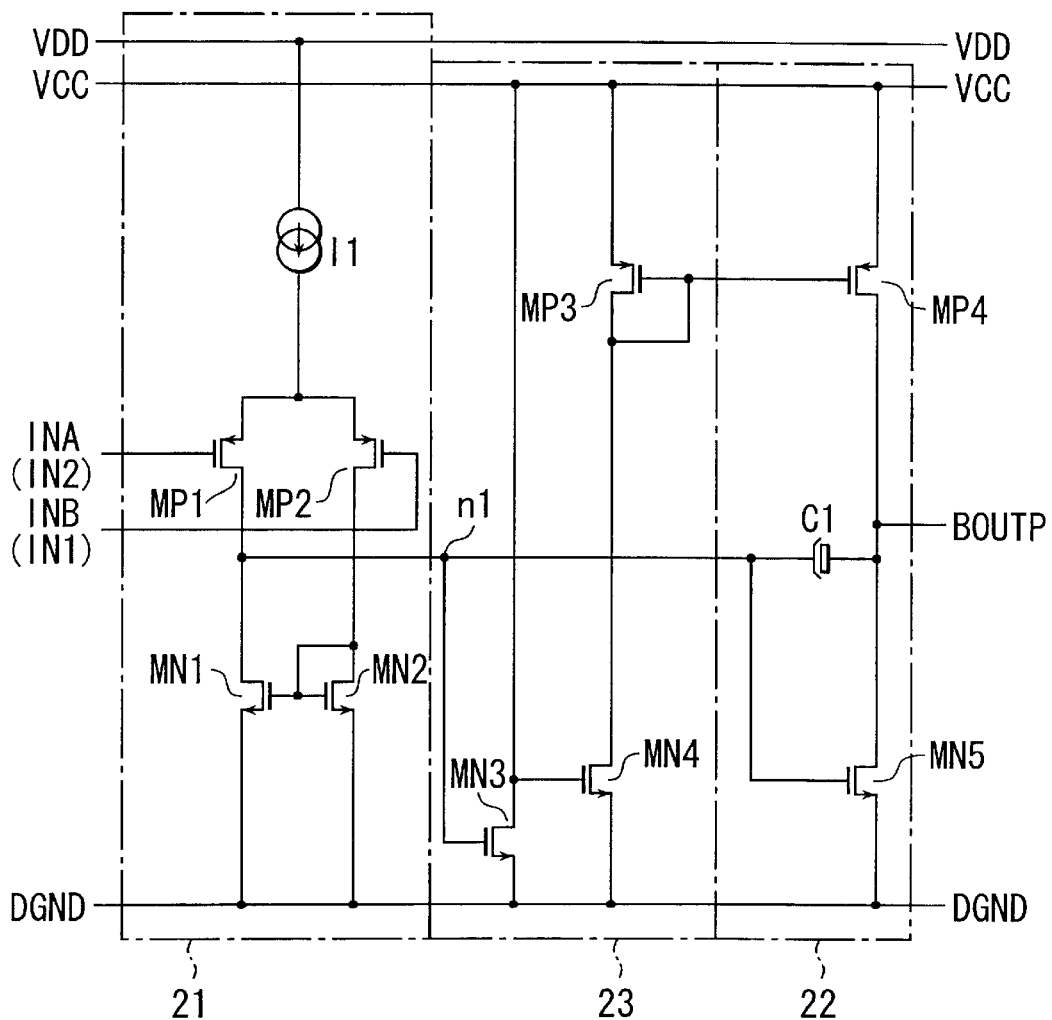
FIG. 2 is a diagram showing a conventional concrete circuit configuration of an output circuit provided in the output circuit section shown in FIG. 1.
Figure 3:
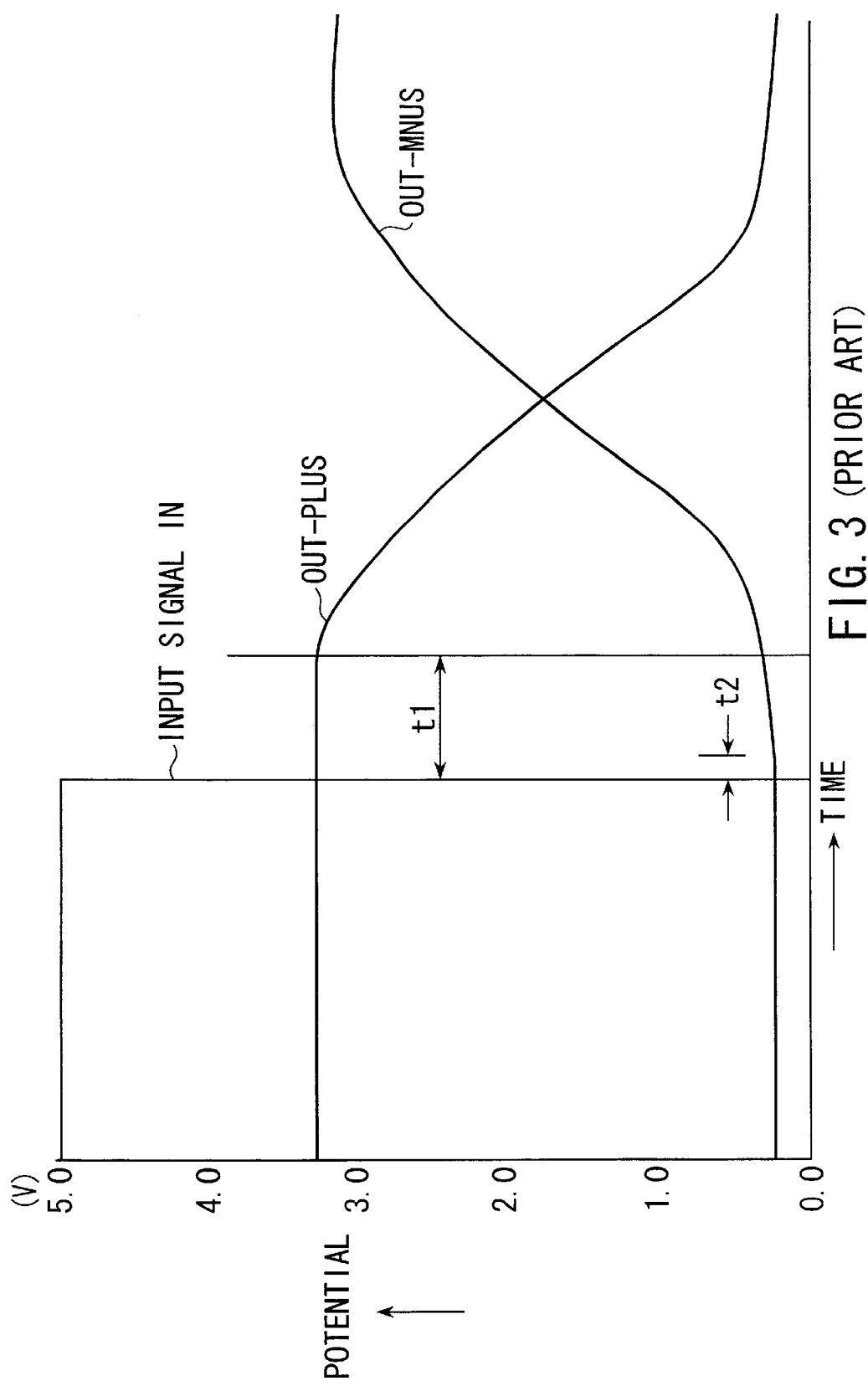
FIG. 3 is a waveform showing an example of a simulation result of input-output characteristics of the output circuit section of FIG. 1 using the conventional output circuit shown in FIG. 2.

In the same way as the voltage comparator circuit 21 of the conventional circuit shown in FIG. 2, the voltage comparator circuit 31 includes a current source I1, PMOS transistors MP1 and MP2, and NMOS transistors MN1 and MN2. Output signals IN1 and IN2 of the two-stage inverting amplifier circuits 11 and 12 shown in FIG. 1 are inputted to gates of the PMOS transistors MP1 and MP2, respectively.

A first end of a current source I1 is connected to a node of the first power supply potential VDD. A second end of the current source I2 is connected to sources of the two PMOS transistors MP1 and MP2. Drain of the PMOS transistor MP1 is connected to drain of the NMOS transistor MN1. Source of the NMOS transistor MN1 is connected to a node of a ground potential DGND. Drain of the PMOS transistor MP2 is connected to drain and gate of the NMOS transistor MN2. Source of the NMOS transistor MN2 is connected to the node of the ground potential DGND.

In addition, gate of the PMOS transistor MP1 is used as a first input terminal INA of the voltage comparator circuit 31. The output signal IN2 of the inverting amplifier circuit 12 shown in FIG. 1 is inputted to the input terminal INA. Gate of the PMOS transistor MP2 is used as a second input terminal INB of the voltage comparator circuit 31. The output signal IN1 of the inverting amplifier circuit 11 shown in FIG. 1 is inputted to the input terminal INB.

Furthermore, gate of the NMOS transistor MN1 is connected together with the gate of the NMOS transistor MN2. The transistors MN1 and MN2 form a current mirror circuit. The common drain connection node of the PMOS transistor MP1 and the NMOS transistor MN1 is used as an output node n2.

It should be noted that in the second output circuit 14 of FIG. 1, the connection relations of the complementary input signals IN1 and IN2 inputted to the gates of the PMOS transistors MP1 and MP2 are opposite to those described above.

In the same way as the voltage comparator circuit 21 shown in FIG. 2, the output stage circuit 32 includes a PMOS transistor MP4 and an NMOS transistor MN5. Source of the PMOS transistor MP4 is connected to a node of the power supply potential VCC, and drain of the PMOS transistor MP4 is connected to an output terminal BOUT. Drain of the NMOS transistor MN5 is connected to an output terminal BOUT, and source of the NMOS transistor MN5 is connected to a node of the ground potential DGND. The output signal fed from the output node n2 of the voltage comparator circuit 31 is inputted to gate of the NMOS transistor MN5 of pull down side.

The output drive control circuit 33 includes a current source circuit 330, an NMOS transistor MN8, an NMOS transistor MN3, an NMOS transistor MN4, and a PMOS transistor MP3. The NMOS transistor MN8 is subjected to current mirror connection so as to fold back a current of the current source circuit 330. Drain of the NMOS transistor MN8 is connected to a node of the power supply potential VDD. The NMOS transistor MN3 is connected between source of the NMOS transistor MN8 and the node of the ground potential DGND. Gate of the NMOS transistor MN3 is connected to the output node n2 of the voltage comparator circuit 31. Gate of the NMOS transistor MN4 is connected to drain of the NMOS transistor MN3, and source of the NMOS transistor MN4 is connected to the node of the ground potential DGND. Source of the PMOS transistor MP3 is connected to the node of the power supply potential VCC, drain of the PMOS transistor MP3 is connected to drain of the NMOS transistor MN4 and gate of the PMOS transistor MP3. A gate-drain connection node of the PMOS transistor MP3 is used as an output node n3 of the output drive control circuit 33. The output node n3 is connected to gate of the PMOS transistor MP4 of pull-up side.

In the current source circuit 330, a constant current source I2, and two NMOS transistors MN7 and MN6 are connected in series between the node of the power supply potential VDD and the node of the ground potential DGND. Gate of the NMOS transistor MN8 is connected to gate of the transistor MN7 which is one of the two NMOS transistors MN7 and MN6.

The output drive control circuit 33 has a function of shifting an "H" level of a signal at the output node n2 of the voltage comparator circuit 31 and inputting the shifted voltage to the gate of the PMOS transistor MP4 of pull-up side.

In the potential limiter circuit 34, MP5 is a PMOS transistor for switching. Source of the PMOS transistor MP5 is connected to the output terminal BOUT. Gate of the PMOS transistor MP5 is connected to the output node n3 of the output drive control circuit 33.

MN11 is an NMOS transistor having its gate and drain connected to the source of the PMOS transistor MP5. MN10 is an NMOS transistor. Gate of the NMOS transistor NM10 is connected to the gate of the NMOS transistor NM11. Drain of the NMOS transistor NM10 is connected to the node of the power supply potential VCC. Source of the NMOS transistor NM11 is connected to the output node n2 of the voltage comparator circuit 31. MN9 is an NMOS transistor. Gate and drain of the NMOS transistor MN9 are connected to the output node n2 of the voltage comparator circuit 31. Source of the NMOS transistor MN9 is connected to the output terminal BOUT. MN12 is an NMOS transistor. Gate and drain of the NMOS transistor MN12 are connected to source of the NMOS transistor NM11. Source of the NMOS transistor MN12 is connected to the node of the ground potential DGND.

Operation of the potential limiter circuit 34 having the above described configuration will now be described.

First, it is assumed that a logic level of the signal at the output node n2 of the voltage comparator circuit 31 is "H". As a result, the PMOS transistor MP4 of pull-up side is in the off-state. The NMOS transistor MN5 of pull-down side is in the on-state, and the output terminal BOUT assumes an "L" level. At this time, the PMOS transistor MP5 is in the off-state, and all of the NMOS transistors MN11, MN12 and MN10 are in the off-state. At this time, the signal potential at the output node n2 of the voltage comparator circuit 31 is clamped to a potential higher than the ground potential DGND by a sum of a source-drain voltage of the NMOS transistor MN5 which is in the on-state and a source-gate voltage (threshold voltage) of the NMOS transistor MN9. As a result, the gate potential of the NMOS transistor MN5 of pull-down side is clamped to a potential which is slightly higher than its drain potential. Assuming now that the threshold voltage of the NMOS transistor MN5 is VthMN5, the signal potential at the output node n2 at this time becomes Vn2(H) which is slightly higher than VthMN5.

Furthermore, it is assumed that the logic level of the signal at the output node n2 of the voltage comparator circuit 31 is "L". As a result, the NMOS transistor MN5 of pull-down side is in the off-state. The PMOS transistor MP4 of pull-up side is in the on-state, and the output terminal BOUT assumes an "H" level. At this time, the PMOS transistor MP5 is in the on-state, and all of the NMOS transistors MN11, MN12 and MN10 are in the on-state. At this time, the signal potential at the output node n2 of the voltage comparator circuit 31 is clamped to a potential, which is raised from the ground potential DGND by a source-gate voltage (threshold voltage) of the NMOS transistor MN12 and a source-gate voltage of the NMOS transistor MN11, and lowered by a source-gate voltage (threshold voltage) of the NMOS transistor MN10.

Figure 5:
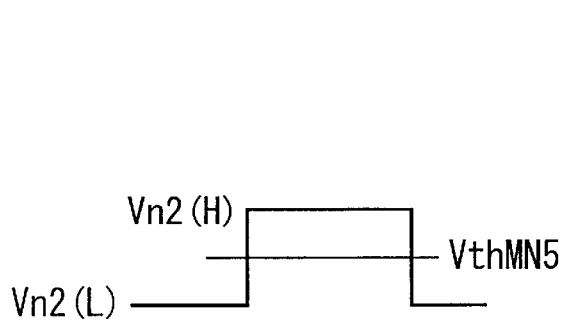
FIG. 5 is a waveform diagram of a signal at a node n2 of the output circuit of FIG. 4.

Here, by suitably setting values of currents flowing through the NMOS transistors MN1O, MN11 and MN12, and device sizes of these NMOS transistors, the signal potential at the output node n2, i.e., the gate potential of the NMOS transistor MN5 of pull-down side is clamped to a potential slightly lower than its threshold voltage. At this time, the signal potential at the output node n2 becomes Vn2(L) which is slightly higher than VthMN5 as shown in FIG. 5.

When the logic level of the signal at the output node n2 of the voltage comparator circuit 31 is "L" and the PMOS transistor MP4 of pull-up side is in the on-state, the gate potential of the PMOS transistor MP4 is clamped to a potential lowered from the power supply potential VCC by an absolute value of a source-gate voltage (threshold voltage) of the PMOS transistor MP5, i.e., a potential slightly lower than VCC−|VthMP4| (where VthMP4 is a threshold voltage of MP4).

In the output circuit of FIG. 4, the feedback capacitor C2 is connected between the output terminal BOUT where the PMOS transistor MP4 is connected to the NMOS transistor MN5 and the output node n2 of the voltage comparator circuit 31 (drive signal output circuit). Therefore, operation which is basically the same as that of the conventional output circuit is conducted.

Furthermore, by the newly added potential limiter circuit 34, the operation of limiting the signal amplitude at the output node n2 of the voltage comparator circuit 31 as described above is added.

When the signal at the output node n2 of the voltage comparator circuit 31 is changed from "L" to "H", therefore, the gate potential of the NMOS transistor MN5 of pull-down side begins to rise from the potential Vn2(L) slightly lower than the threshold voltage (VthMN5), and reaches the threshold voltage in a moment. The NMOS transistor MN5 thus turns on. Therefore, the time taken for the output terminal BOUT to fall to the "L" level is shortened.

On the contrary, when the signal at the output node n2 of the voltage comparator circuit 31 is changed from "H" to "L", the gate potential of the NMOS transistor MN5 of pull-down side begins to fall from the potential Vn2(H) slightly higher than the threshold voltage (VthMN5), and reaches the threshold voltage in a moment. The NMOS transistor MN5 thus turns off.

Furthermore, the gate potential of the PMOS transistor MP4 of pull-up side begins to rise from VCC−|VthMP4|. Accordingly, the PMOS transistor MP4 turns off in a moment. As a result, the time taken for the output terminal BOUT to rise to the "H" level is shortened.

Figure 6:
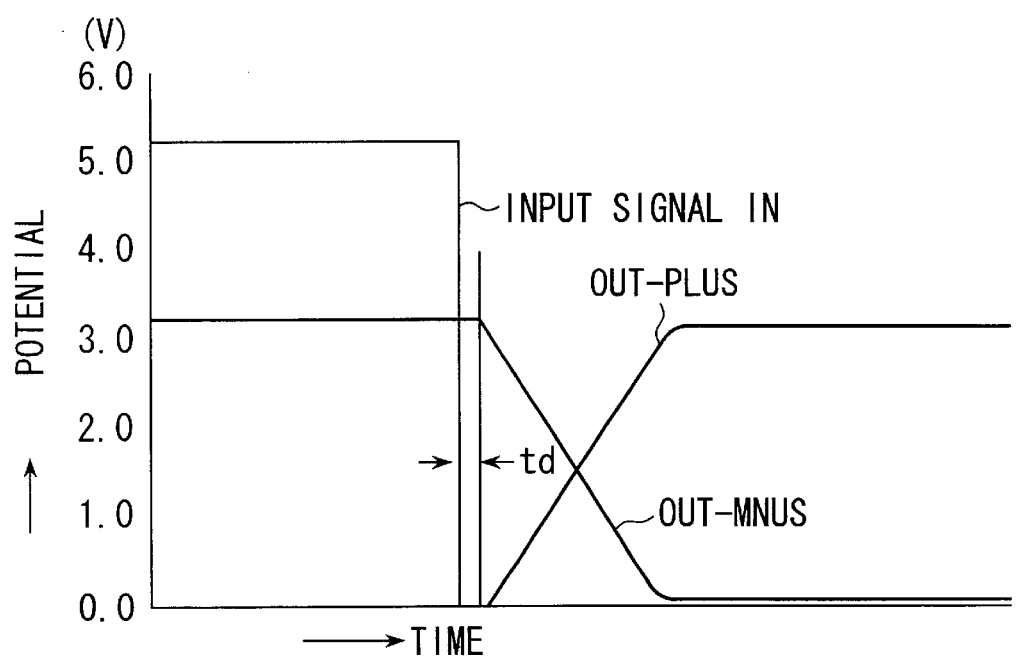
FIG. 6 is a waveform diagram showing an example of a simulation result of input-output characteristics in the output circuit section of FIG. 1 using an output circuit of the embodiment of FIG. 4.

FIG. 6 shows an example of a simulation result of input-output characteristics in the output circuit section of FIG. 1 using the output circuit of the embodiment shown in FIG. 4.

According to the input-output characteristics, the PMOS transistor MP4 and the NMOS transistor MN5 in the output stage circuit 32 are activated in response to a change of the signal potential at the output node n2 of the voltage comparator circuit 31 caused by a change of the input signal IN. The delay time required for the NMOS transistor MN5 of pull-down side to begin to change from the off-state to the on-state in one of the output circuits and the delay time required for the NMOS transistor MN5 of pull-down side to begin to change from the on-state to the off-state in the other of the output circuits can be substantially set to the same time td. It is thus possible to sufficiently satisfy the specifications which stipulate the time taken until a crosspoint where both output signals OUT-PLUS and OUT-MINUS cross each other is reached.

In the above described embodiment, the voltage comparator circuit 31 serving as the drive signal output circuit may have any configuration so long as it has a function of outputting a drive signal having a logic level set according to the logic levels of the two input signals IN1 and IN2. The voltage comparator circuit 31 needs only to have a basic configuration as shown in, for example, FIG. 7.

Figure 7:
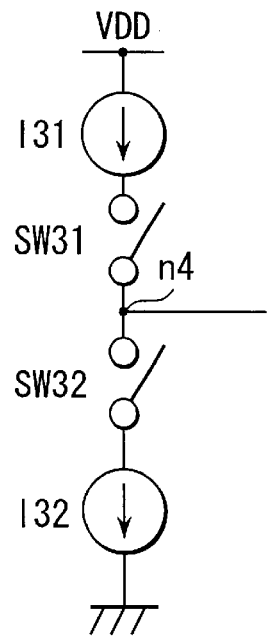
FIG. 7 is a circuit diagram showing the basic configuration of a voltage comparator circuit serving as a drive signal output circuit.

In the drive signal output circuit shown in FIG. 7, a first current source I31 and a first switch element SW31 are connected in series between the node of the power supply potential VDD and an output node n4. A second switch element SW32 and a second current source I32 are connected in series between the output node n4 and the ground potential DGND. As for the first switch element SW31 and the second switch element SW32, either one of them is selected and controlled to turn on on the basis of the two input signals IN1 and IN2.

Figure 8:
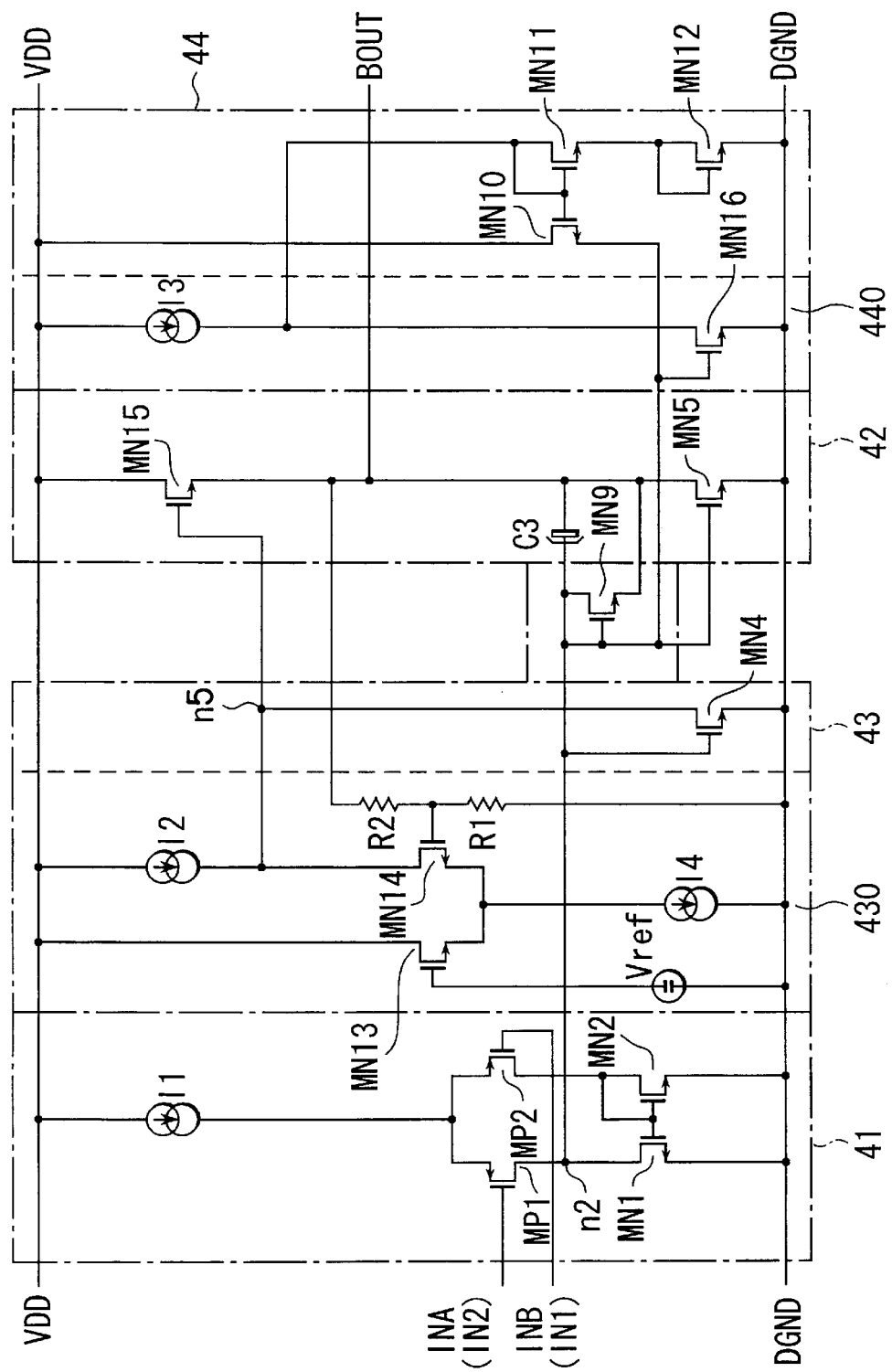
FIG. 8 is a circuit diagram showing an output circuit according to a second embodiment of the present invention.

A second embodiment of the present invention will now be described. FIG. 8 shows an output circuit according to a second embodiment of the present invention.

In this output circuit, numeral 41 denotes a voltage comparator circuit (drive signal output circuit), 42 an output stage circuit of NMOS type, and 43 an output drive control circuit of CMOS type. These circuits are supplied with a first power supply potential VDD and a ground potential DGND. The internal configuration of the voltage comparator circuit 41 is the same as that of the voltage comparator circuit 31 in the first embodiment shown in FIG. 4, and consequently description thereof will be omitted. Numeral 44 denotes a potential limiter circuit.

BOUT denotes an output terminal of the output stage circuit 42. C3 denotes a feedback capacitor. The potential limiter circuit 44 limits a signal amplitude at an output node n2 of the voltage comparator circuit 41.

In the output stage circuit 42, an NMOS transistor MN15 of pull-up side and an NMOS transistor MN5 of pull-down side are connected in series between the node of the power supply potential VDD and the node of the ground potential DGND. Drain of the NMOS transistor MN15 of pull-up side is connected to the node of the power supply potential VDD, and source of the NMOS transistor MN15 is connected to the output terminal BOUT. Drain of the NMOS transistor MN5 of pull-down side is connected to the output terminal BOUT, and source of the NMOS transistor MN5 is connected to the node of the ground potential DGND.

Gate of the NMOS transistor MN5 of pull-down side is connected to the output node n2 of the voltage comparator circuit 41, and gate of the NMOS transistor MN15 of pull-up side is connected to an output node n5 of the output drive control circuit 43.

The output drive control circuit 43 slightly differs in configuration from the output drive control circuit 33 shown in FIG. 4. The output drive control circuit 43 includes a current source circuit 430, and an NMOS transistor MN4. The NMOS transistor MN4 is connected between the output node n4 which is common to an output node of the current source circuit 430 and the node of the ground potential DGND. Gate of the NMOS transistor MN4 is connected to the output node n2 of the voltage comparator circuit 41.

The current source circuit 430 includes resistors R1 and R2 for voltage division, NMOS transistors MN13 and MN14 forming a NMOS differential pair, a constant current source I4, and a current source I2. The resistors R1 and R2 are connected between the output terminal BOUT and the node of the ground potential DGND. Gates of the NMOS transistors MN13 and MN14 are supplied with a reference voltage Vref and a voltage (hereafter referred to as comparison voltage) generated by voltage division using the resistors R1 and R2, respectively. The constant current source I4 is connected between a common source connection node of the NMOS transistors MN13 and MN14 and the node of the ground potential DGND. The current source I2 is connected between drain of the NMOS transistor MN14, i.e., the output node n5 and the node of the power supply potential VDD. And drain of the NMOS transistor MN13 is connected to the node of the power supply potential VDD.

Operation of the output drive control circuit 43 will now be described.

First, when the signal at the output node n2 of the voltage comparator circuit 41 is "H," the NMOS transistor MN4 turns on, and the drain of the NMOS transistor MN4 becomes "L". Thus the NMOS transistor MN15 turns off. At this time, the NMOS transistor MN5 of pull-down side is in the on-state, and the potential of the output terminal BOUT becomes "L". In this case, the comparison voltage is lower than the reference voltage Vref. Therefore, the NMOS transistor MN14 in the differential pair turns off, and the NMOS transistor MN13 in the differential pair turns on. The current of the current source I2 in the current source circuit 430 flows into the NMOS transistor MN4. The signal at the output node n5 of the current source circuit 430 thus becomes "L". Accordingly, the NMOS transistor MN15 of pull-up side turns off.

On the contrary, when the output of the voltage comparator circuit 41 is "L", the NMOS transistor MN4 turns off, and the the NMOS transistor MN5 of pull-down side turns off. At this time, the comparison voltage is higher than the reference voltage Vref. Therefore, the NMOS transistor MN14 in the differential pair turns on, and the NMOS transistor MN13 in the differential pair turns off. The signal at the output node n5 of the current source circuit 430 thus becomes "H". Accordingly, the NMOS transistor MN15 of pull-up side turns on.

The potential limiter circuit 44 differs in the following points from the potential limiter circuit 43 in the first embodiment shown in FIG. 4. Except the following points, they are the same circuit, and consequently components are denoted by like characters.

(1) The PMOS transistor MP5 for switching is omitted.

(2) A current source circuit 440 is newly added. The current source circuit 440 includes a current source I3 and an NMOS transistor MN16 for switching connected in series between the node of the power supply potential VDD and the node of the ground potential DGND.

(3) The gate and drain of the NMOS transistor MN11 are connected to drain of the NMOS transistor MN16 for switching.

Operation of the potential limiter circuit 44 having the above described configuration is basically the same as the operation of the potential limiter circuit 34 shown in FIG. 4. However, the NMOS transistor MN16 for switching is connected to the current source I3. When the signal at the output node n2 of the voltage comparator circuit 41 is "H", therefore, all of the NMOS transistors MN11, MN12 and MN10 turn off. When the signal at the output node n2 of the voltage comparator circuit 41 is "L", all of the NMOS transistors MN11, MN12 and MN10 turn on.

In other words, when the signal at the output node n2 of the voltage comparator circuit 41 is "H", the NMOS transistor MN16 turns on, and the signal at the drain of the NMOS transistor MN16 becomes "L", all of the NMOS transistors MN11, MN12 and MN10 being thus turned off.

On the contrary, when the signal at the output node n2 of the voltage comparator circuit 41 is "L", the NMOS transistor MN16 turns off, and the signal at the drain of the NMOS transistor MN16 is changed to "L" via the current source I3, all of the NMOS transistors MN11, MN12 and MN10 being thus turned on.

Therefore, there is an advantage that the restriction imposed when the transistor MP4 of pull-up side is used as a current source as in the potential limiter circuit 34 of FIG. 1 is mitigated.

The operation of the output circuit of FIG. 8 is basically the same as that of the output circuit of FIG. 4. Therefore, effects similar to those of FIG. 4 are obtained.

Furthermore, in the output circuit of FIG. 8, an NMOS transistor is used as the transistor of pull-up side in the output stage circuit 42 in the same way as the transistor of pull-down side. If an NMOS transistor, i.e., the NMOS transistor MN15 is used as the transistor of pull-up side, a voltage lowered from the gate potential by the threshold voltage is outputted to the output terminal BOUT when the NMOS transistor MN15 has turned on. Therefore, if VDD is supplied as the power supply potential, and the threshold voltage of the NMOS transistor MN15 is set so as to make "H" of the signal outputted from the output terminal BOUT when the NMOS transistor MN15 has turned on substantially equal to VDD, then the output circuit of FIG. 8 can be activated with a single power supply, unlike the output circuit of FIG. 4.

According to the output circuit of the semiconductor integrated circuit of the present invention as described above, the potential amplitude at the output node of the drive signal output circuit is made small to such a range that the NMOS transistor of pull-down side in the output stage circuit sufficiently turns on/off the potential, by providing the limiter circuit. As a result, the time taken until the NMOS transistor of pull-down side in the output stage circuit in the off state begins to turn on and the time taken until the NMOS transistor in the on state begins to turn off can be made substantially equal and sufficiently short. Therefore, favorable input-output characteristics can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An output circuit of semiconductor circuit, comprising:
   a drive signal output circuit having a first output node, said drive signal output circuit outputting a drive signal from said first output node;
   an output stage circuit including a first transistor for pull-up and a second transistor for pull-down, said first transistor having a gate, said first transistor being connected between a power supply potential node and an output terminal, said second transistor having a gate connected to said first output node of said drive signal output circuit, said second transistor being connected between said output terminal and a ground potential node;
   an output drive control circuit having second output node, said output drive control circuit being connected to said first output node of said drive signal output circuit, said output drive control circuit outputting a signal to be supplied to the gate of said first transistor, based on the signal of said first output node of said drive signal output circuit;
   a feedback capacitor connected between said output terminal and said first output node of said drive signal output circuit; and
   a potential limiter circuit connected to said output terminal and said first output node of said drive signal output circuit, said potential limiter circuit limiting an amplitude of the signal of said first output node of said drive signal output circuit so as to confine the amplitude with a predetermined range.

2. The circuit according to claim 1, wherein said first transistor is a P-channel transistor, and said second transistor is an N-channel transistor.

3. The circuit according to claim 2, wherein said drive signal output circuit comprises:
   a first current source having a first end and a second end, the first end of said first current source being connected to said power supply potential node;
   a third transistor of P-channel having a first end, a second end, and a gate, the first end of said third transistor being connected to the second end of said first current source, the gate of said third transistor being supplied with a first input signal;
   a fourth transistor of P-channel having a first end, a second end, and a gate, the first end of said fourth transistor being connected to the second end of said first current source, the gate of said fourth transistor being supplied with a second input signal having a phase opposite to that of said first input signal;
   a fifth transistor of N-channel having a first end, a second end, and a gate, the first end of said fifth transistor being connected to the second end of said third transistor, the gate of said fifth transistor being connected to the second end of said fourth transistor, the second end of said fifth transistor being connected to said ground potential node; and
   a sixth transistor of N-channel having a first end, a second end, and a gate, the first end and the gate of said sixth transistor being connected to the second end of said fourth transistor, the second end of said sixth transistor being connected to said ground potential node.

4. The circuit according to claim 2, wherein said drive signal output circuit comprises:
   a first current source and a first switch element connected in series between said power supply potential node and said first output node of said drive signal output circuit; and
   a second switch element and a second current source connected in series between said first output node of said drive signal output circuit and said ground potential node, one of said first switch element and said second switch element being selected and controlled to turn on.

5. The circuit according to claim 2, wherein said potential limiter circuit comprises:
   a third transistor of P-channel having a first end, a second end, and a gate, the first end of said third transistor being connected to said output terminal, the gate of said third transistor being connected to said second output node of said second output drive control circuit;
   a fourth transistor of N-channel having a first end, a second end, and a gate, the first end and the gate of said fourth transistor being connected to the second end of said third transistor;

a fifth transistor of N-channel having a first end, a second end, and a gate, the first end of said fifth transistor being connected to said power supply potential node, the gate of said fifth transistor being connected to the gate of said fourth transistor, the second end of said fifth transistor being connected to said first output node of said drive signal output circuit;

a sixth transistor of N-channel having a first end, a second end, and a gate, the first end and the gate of said sixth transistor being connected to the second end of said fourth transistor, the second end of said sixth transistor being connected to said ground potential node; and a seventh transistor of N-channel having a first end, a second end, and a gate, the first end and the gate of said seventh transistor being connected to said first output node of said drive signal output circuit, the second end of said seventh transistor being connected to said output terminal.

6. The circuit according to claim 2, wherein said output drive control circuit comprises:

a first current source having a first end and a second end, the first end of said first current source being connected to said power supply potential node;

a third transistor of N-channel having a first end, a second end, and a gate, the first end of said third transistor being connected to the second end of said first current source;

a fourth transistor of N-channel having a first end, a second end, and a gate, the first end and the gate of said fourth transistor being connected to the second end of said third transistor, the second end of said third transistor being connected to said ground potential node;

a fifth transistor of N-channel having a first end, a second end, and a gate, the first end of said fifth transistor being connected to said power supply potential node, the gate of said fifth transistor being connected to the gate of said third transistor;

a sixth transistor of N-channel having a first end, a second end, and a gate, the first end of said sixth transistor being connected to the second end of said fifth transistor, the gate of said sixth transistor being connected to said first output node of said drive signal output circuit, the second end of said sixth transistor being connected to said ground potential node;

a seventh transistor of P-channel having a first end, a second end, and a gate, the first end of said seventh transistor being connected to said power supply potential node, the gate of said seventh transistor being connected to the second end of said seventh transistor; and a eighth transistor of N-channel having a first end, a second end, and a gate, the first end of said eighth transistor being connected to the second end of said seventh transistor, the gate of said eighth transistor being connected to a common connection node of the second end of said fifth transistor and the first end of said sixth transistor, the second end of said eighth transistor being connected to said ground potential node.

7. The circuit according to claim 1, wherein both said first and second transistors are N-channel transistors.

8. The circuit according to claim 7, wherein said potential limiter circuit comprises:

a first current source having a first end and a second end, the first end of said first current source being connected to said power supply potential node;

a third transistor of N-channel having a first end, a second end, and a gate, the first end of said third transistor being connected to the second end of said first current source, the gate of said third transistor being connected to said first output node of said drive signal output circuit, the second end of said third transistor being connected to said ground potential node;

a fourth transistor of N-channel having a first end, a second end, and a gate, the first end and the gate of said fourth transistor being connected to the second end of said first current source;

a fifth transistor of N-channel having a first end, a second end, and a gate, the first end of said fifth transistor being connected to said power supply potential node, the gate of said fifth transistor being connected to the gate of said fourth transistor, the second end of said fifth transistor being connected to said first output node of said drive signal first output circuit;

a sixth transistor of N-channel having a first end, a second end, and a gate, the first end and the gate of said sixth transistor being connected to the second end of said fourth transistor, the second end of said sixth transistor being connected to said ground potential node; and a seventh transistor of N-channel having a first end, a second end, and a gate, the first end and the gate of said seventh transistor being connected to said first output node of said drive signal output circuit, the second end of said seventh transistor being connected to said output terminal.

9. The circuit according to claim 7, wherein said output drive control circuit comprises:

a third transistor having a first end, a second end, and a gate, the first end of said third transistor being connected to said power supply potential node;

a reference voltage source for supplying a reference voltage to the gate of said third transistor;

a first current source having a first end and a second end, the first end of said first current source being connected to said power supply potential node, the second end of said first current source being connected to a gate of said first transistor;

a fourth transistor of N-channel having a first end, a second end, and a gate, the first end of said fourth transistor being connected to the second end of said first current source, the second end of said fourth transistor being connected in common to the second end of said third transistor;

a second current source having a first end and a second end, the first end of said second current source being connected to the common second end connection node of said third and fourth transistors, the second end of said second current source being connected to said ground potential node;

a voltage divider circuit connected to said output terminal, said voltage divider circuit dividing a voltage of said output terminal and supplying a resultant voltage to the gate of said fourth transistor;

a fifth transistor having a first end, a second end, and a gate, the first end of said fifth transistor being connected to the gate of said first transistor, the gate of said fifth transistor being connected to first said output node of said drive signal output circuit, the second end of said fifth transistor being connected to said ground potential node.

10. An output circuit of semiconductor circuit, comprising:
- a drive signal output circuit connected between a first power supply potential node and a ground potential node, said drive signal output circuit having a first output node, said drive signal output circuit outputting a drive signal having an amplitude between said first power supply potential and the ground potential, from said first output node;
- an output stage circuit including a first transistor for pull-up and a second transistor for pull-down, said first transistor being connected between a second power supply potential node and an output terminal, said first transistor having a gate, said second transistor having a gate connected to said output node of said drive signal output circuit, said second transistor being connected between said output terminal and said ground potential node;
- an output drive control circuit having a second output node, said output drive control circuit being connected to said first output node of said drive signal output circuit, said output drive control circuit outputting a signal to be supplied to the gate of said first transistor, based on the signal of said first output node of said drive signal output circuit;
- a feedback capacitor connected between said output terminal and said first output node of said drive signal output circuit; and
- a potential limiter circuit connected to said output terminal and said first output node of said drive signal output circuit, said potential limiter circuit limiting an amplitude of the signal of said first output node of said drive signal output circuit so as to confine the amplitude with a predetermined range.

11. The circuit according to claim 10, wherein said first transistor is a P-channel transistor, and said second transistor is an N-channel transistor.

12. The circuit according to claim 11, wherein said first power supply potential is higher than said second power supply potential.

13. The circuit according to claim 12, wherein said drive signal output circuit comprises:
- a first current source having a first end and a second end, the first end of said first current source being connected to said first power supply potential node;
- a third transistor of P-channel having a first end, a second end, and a gate, the first end of said third transistor being connected to the second end of said first current source, the gate of said third transistor being supplied with a first input signal;
- a fourth transistor of P-channel having a first end, a second end, and a gate, the first end of said fourth transistor being connected to the second end of said first current source, the gate of said fourth transistor being supplied with a second input signal having a phase opposite to that of said first input signal;
- a fifth transistor of N-channel having a first end, a second end, and a gate, the first end of said fifth transistor being connected to the second end of said third transistor, the gate of said fifth transistor being connected to the second end of said fourth transistor, the second end of said fifth transistor being connected to said ground potential node; and
- a sixth transistor of N-channel having a first end, a second end, and a gate, the first end and the gate of said sixth transistor being connected to the second end of said fourth transistor, the second end of said sixth transistor being connected to said ground potential node.

14. The circuit according to claim 12, wherein said drive signal output circuit comprises:
- a first current source and a first switch element connected in series between said first power supply potential node and said first output node of said drive signal output circuit; and
- a second switch element and a second current source connected in series between said first output node of said drive signal output circuit and said ground potential node, one of said first switch element and said second switch element being selected and controlled to turn on.

15. The circuit according to claim 12, wherein said potential limiter circuit comprises:
- a third transistor of P-channel having a first end, a second end, and a gate, the first end of said third transistor being connected to said output terminal, the gate of said third transistor being connected to said first output node of said output drive control circuit;
- a fourth transistor of N-channel having a first end, a second end, and a gate, the first end and the gate of said fourth transistor being connected to the second end of said third transistor;
- a fifth transistor of N-channel having a first end, a second end, and a gate, the first end of said fifth transistor being connected to said second power supply potential node, the gate of said fifth transistor being connected to the gate of said fourth transistor, the second end of said fifth transistor being connected to said first output node of said drive signal output circuit;
- a sixth transistor of N-channel having a first end, a second end, and a gate, the first end and the gate of said sixth transistor being connected to the second end of said fourth transistor, the second end of said sixth transistor being connected to said ground potential node; and
- a seventh transistor of N-channel having a first end, a second end, and a gate, the first end and the gate of said seventh transistor being connected to said first output node of said drive signal output circuit, the second end of said seventh transistor being connected to said output terminal.

16. The circuit according to claim 12, wherein said output drive control circuit comprises:
- a first current source having a first end and a second end, the first end of said first current source being connected to said first power supply potential node;
- a third transistor of N-channel having a first end, a second end, and a gate, the first end of said third transistor being connected to the second end of said first current source;
- a fourth transistor of N-channel having a first end, a second end, and a gate, the first end and the gate of said fourth transistor being connected to the second end of said third transistor, the second end of said fourth transistor being connected to said ground potential node;
- a fifth transistor of N-channel having a first end, a second end, and a gate, the first end of said fifth transistor being connected to said second power supply potential node, the gate of said fifth transistor being connected to the gate of said third transistor;
- a sixth transistor of N-channel having a first end, a second end, and a gate, the first end of said sixth transistor being connected to the second end of said fifth transistor, the gate of said sixth transistor being connected to said first output node of said drive signal output circuit, the second end of said sixth transistor being connected to said ground potential node;

a seventh transistor of P-channel having a first end, a second end, and a gate, the first end of said seventh transistor being connected to said second power supply potential node, the gate of said seventh transistor being connected to the second end of said seventh transistor; and an eighth transistor of N-channel having a first end, a second end, and a gate, the first end of said eighth transistor being connected to the second end of said seventh transistor, the gate of said eighth transistor being connected to a common connection node of the second end of said fifth transistor and the first end of said sixth transistor, the second end of said eighth transistor being connected to said ground potential node.

* * * * *